United States Patent
Feurle

(12) 
(10) Patent No.: US 6,643,211 B2
(45) Date of Patent: Nov. 4, 2003

(54) INTEGRATED MEMORY HAVING A PLURALITY OF MEMORY CELL ARRAYS

(75) Inventor: Robert Feurle, Neubiberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/090,306

(22) Filed: Mar. 4, 2002

(65) Prior Publication Data

US 2002/0122345 A1 Sep. 5, 2002

(30) Foreign Application Priority Data

Mar. 2, 2001 (DE) ......................................... 101 10 274

(51) Int. Cl.$^7$ ................................................ G11C 8/00
(52) U.S. Cl. ............................ 365/230.03; 365/230.06; 365/233
(58) Field of Search ..................... 365/230.03, 230.06, 365/233, 189.01, 189.05, 238.5, 189.04, 230.02

(56) References Cited

U.S. PATENT DOCUMENTS 5,818,785 A * 10/1998 Ohshima ............... 365/230.03
5,831,924 A * 11/1998 Nitta et al. ............ 365/230.03
6,097,660 A * 8/2000 Tsuchida et al. ....... 365/230.03
6,185,149 B1 * 2/2001 Fujioka et al. .............. 365/233

FOREIGN PATENT DOCUMENTS

DE 32 07 210 A1 10/1982

OTHER PUBLICATIONS

Marc Haberland: "Synchrone laufen schneller: Funktionsweise und Technologie synchroner DRAMs"[synchronous ones work faster functionality and technology of synchronous DRAMs], Elektronik, No. 19, 1995, pp. 113, 114, 116, 118–119.

* cited by examiner

Primary Examiner—David Nelms
Assistant Examiner—Gene N. Auduong
(74) Attorney, Agent, or Firm—Laurence A. Greenberg; Werner H. Stemer; Gregory L. Mayback

(57) ABSTRACT

What is specified is an integrated memory having a plurality of memory cell arrays that are each assigned row decoders and column decoders. During read or write operations in the present integrated memory, in each case at least two word lines are activated simultaneously, in each case only one bit line being selected simultaneously. Compared with conventional memory architectures, this results in a high data rate even at very high frequencies and with a variable burst length, and additionally in a comparatively low power loss.

5 Claims, 1 Drawing Sheet

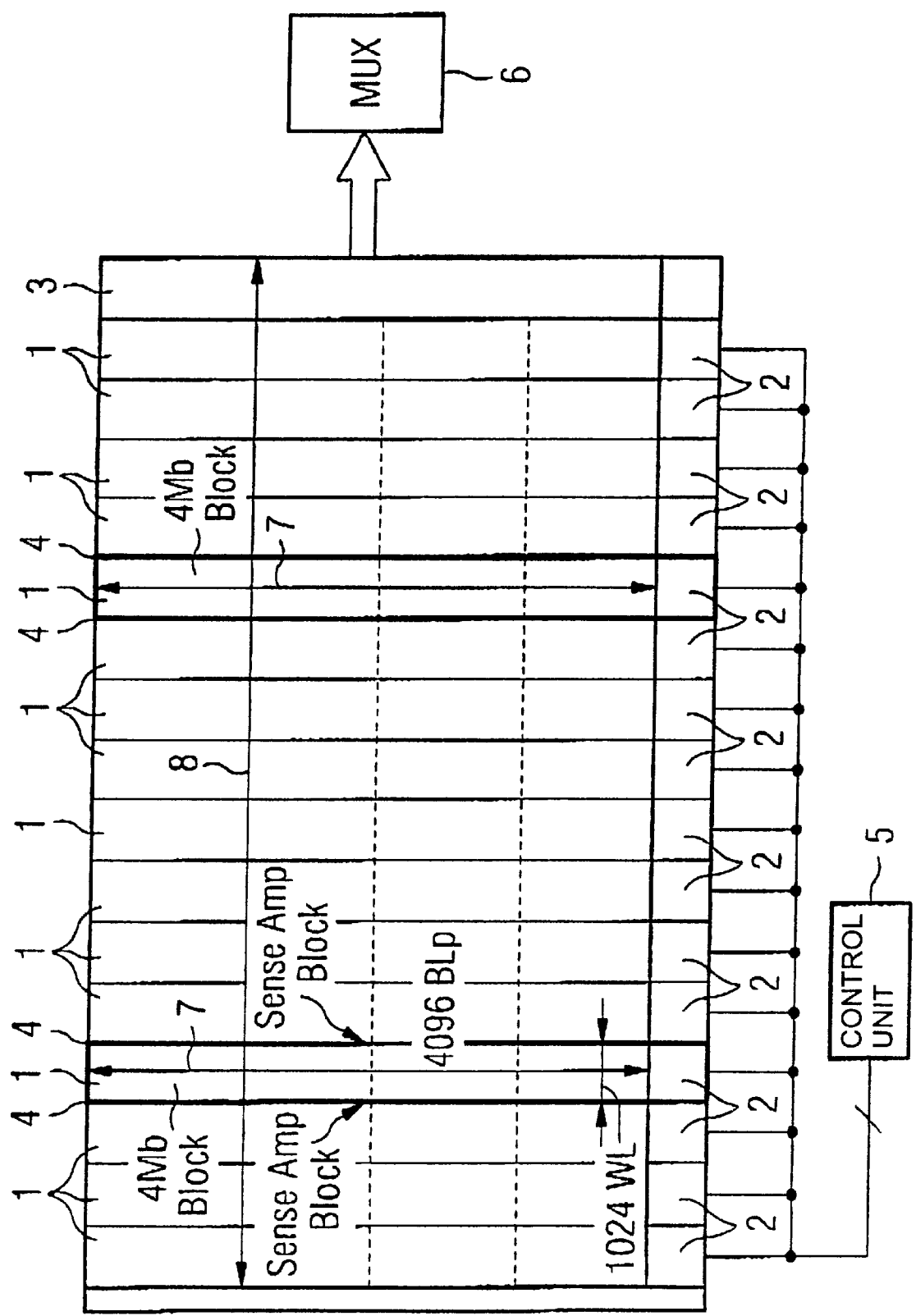

INTEGRATED MEMORY HAVING A PLURALITY OF MEMORY CELL ARRAYS

BACKGROUND OF THE INVENTION

Field of the Invention

The present invention relates to an integrated memory having a plurality of memory cell arrays which in each case have word lines for the selection of memory cells and bit lines for reading out or writing data signals of the memory cells.

Integrated memories usually have one or more memory cells connected to the bit lines and word lines. In this case, the memory cells are disposed at crossover points between the bit lines and word lines. The memory cells are in each case connected to one of the word lines. For the selection of the memory cells, in the case of a dynamic random access memory (DRAM), for example, selection, transistors of memory cells are turned on by an activated word line, as a result of which a data signal can subsequently be read out from or written to a corresponding selected memory cell. For this purpose, the selected memory cell is connected via the selection transistor to one of the bit lines, via which the corresponding data signal is read out or written in.

In the case of a memory cell access, usually a plurality of memory cells are read from or written to within an access cycle. By way of example, all of the memory cells along an activated word line can be read from or written to. Such a memory cell access is generally referred to as a so-called burst and the number of selected memory cells or the number of read or write steps to be performed within an access cycle is referred to as the burst length.

The burst length is usually programmed in a so-called mode register. During an access cycle, a respective decoder that is assigned to a memory cell array is addressed for the selection of a word line and a number of bit lines, depending on the burst length. In this case, the decoder can carry out the actions of activation, reading or writing and precharging, or select the relevant word line and relevant bit lines therefor.

In order to achieve very high frequencies, for example greater than 200 megahertz, at high data rates, the column address can be altered, for example, by a counter in the event of activation of a word line during a burst. However, the performance of memory accesses using this principle is limited, especially as an additional counter, a so-called column counter, is necessary which, in the case of an active word line and during a burst, can change over the column address from a first to a second address.

SUMMARY OF THE INVENTION

It is accordingly an object of the invention to provide an integrated memory having a plurality of memory cell arrays that overcomes the above-mentioned disadvantages of the prior art devices of this general type, which enables high data rates even at very high frequencies with a low outlay.

With the foregoing and other objects in view there is provided, in accordance with the invention, an integrated memory. The memory contains a plurality of memory cell arrays having memory cells, word lines for selecting the memory cells, and bit lines for reading out or writing in data signals from/to the memory cells. Decoders, including word line decoders and a bit line decoder, are connected to the memory cell arrays for selecting the bit lines and the word lines. A control circuit has an input side and is connected to the decoders. The control circuit addresses the word lines and the bit lines, and if one of a read command and a write command is present on the input side of the control circuit, at least two of the word lines can be activated simultaneously. A multiplexer is provided and has an input side coupled to the bit line decoder for addressing the bit lines. The multiplexer is configured such that in a burst mode read access, in each clock period, a datum assigned to addressed memory cells is output until a burst mode operation advances by a predetermined burst length.

The control circuit may be a mode register, for example.

In this case, in the integrated memory described, a continuous data stream is to be understood to be that, by use of the multiplexer, in a burst mode operation, in each clock period, a datum assigned to the addressed memory cells is output until the burst mode operation advances by a predetermined burst length.

In this case, the burst length can be predetermined by the definition of the simultaneously activated word lines by the control circuit.

As a result of simultaneous activation of a plurality of word lines, a corresponding multiple of data is available at a data output of the integrated memory, which can be coupled to the bit line decoder of the memory. By way of example, if two word lines are activated, twice as many crossover points between activated word lines and activated bit lines are produced, with the result that overall twice as many data bits can be read out, in other words the burst length is doubled compared with conventionally one activated word line.

Correspondingly, if four word lines are selected simultaneously, four times the volume of data, that is to say four times the burst length, is achieved. In a read access with more activated word lines, more data are made available from the semiconductor memory and are then combined by the multiplexer to form a continuous data stream.

Consequently, in the case of the principle described, the burst length is determined by the number of word lines simultaneously selected or activated by the control circuit. Accordingly, a variable burst length can be attained with the present principle.

As already explained in the introduction, burst length is to be understood to be the number of selected memory cells or the number of read or write steps to be performed within an access cycle.

According to the invention, a write operation is also possible by analogy with the read operation described, during which write operation a continuous data stream is correspondingly broken down by the multiplexer, in a demultiplexing operation, into data to be written to the different memory cells assigned to the respective word lines.

Preferably, each memory cell array may be assigned a dedicated row decoder for the addressing of the word lines of the assigned memory cell array.

As an alternative or in addition, a common column decoder may be provided which is assigned to a plurality of memory cell arrays.

The special feature in the present invention is that there is no changeover (toggling) between different columns during a burst, and, accordingly, a column address counter, a so-called column counter, required for this can be obviated.

Overall, the principle described yields, at very high frequencies of even greater than 200 megahertz, a high data rate with a variable burst length. In this case, the burst length may be proportional to the number of activated word lines and may be, for example, two, four or eight.

The integrated memory described also has advantageous properties with regard to the power loss and thus with regard to the evolution of heat, since although activating a doubled number of word lines in accordance with the proposed principle requires a doubled current, the simultaneous doubling of the burst length on account of the doubled volume of data results, however, that double the time is available, so that overall the power remains the same.

Since the plurality of word lines which can be activated simultaneously must be accessible independently of one another in the integrated memory, they may be disposed in different memory cell arrays, each having a dedicated driver stage (sense amp block), and be addressable independently of one another, for example by independent row decoders.

In one advantageous embodiment of the present invention, the word lines which can be activated simultaneously by the control circuit are disposed in different memory cell arrays which are each assigned a word line or row line decoder.

In a further preferred embodiment of the present invention, the control circuit, for the simultaneous activation of exactly two word lines, is connected to word line decoders assigned to the respective memory cell arrays.

By way of example, if the integrated memory described conventionally has a burst length of two, then activation of exactly two word lines simultaneously results in a burst length of four, the correspondingly selected data being able to be combined by the multiplexer to form a continuous data stream.

In a further preferred embodiment of the present invention, the control circuit, for the simultaneous activation of exactly four word lines, is connected to word line decoders assigned to the respective memory cell arrays. In accordance with the above description for two word lines, given a conventional burst length of two, activation of four word lines simultaneously results in a burst length of eight.

In accordance with a concomitant feature of the invention, the multiplexer is constructed such that the predetermined burst length is dependent on a number of the word lines respectively activated simultaneously by the control circuit.

Other features which are considered as characteristic for the invention are set forth in the appended claims.

Although the invention is illustrated and described herein as embodied in an integrated memory having a plurality of memory cell arrays, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The single FIGURE of the drawing is a simplified block diagram of an exemplary embodiment according to the invention.

DESCRIPTION OF THE PREFERRED EMBODIMENT

Referring now to the single FIGURE of the drawing, there is shown an integrated memory having a plurality of memory cell arrays 1. In this case, the memory cell arrays 1 are disposed next to one another.

In the present exemplary embodiment, the memory cell arrays 1 each contain four memory blocks having a storage capacity of four megabits in each case. The memory cells of the memory cell arrays 1 are in each case determined unambiguously by crossover points of word lines 7 and bit lines 8. For the selection of the word lines 7, each memory cell array 1 is assigned a respective row decoder 2. The row decoder 2 is in each case depicted below the memory cell array 1 assigned to it. Furthermore, the memory cell arrays 1 are assigned a common column decoder 3 that is suitable for the selection of the respective bit lines 8. Accordingly, the row and column decoders 2, 3 enable an unambiguous selection or addressing of memory cells in the memory cell arrays 1 by activation of the word and bit lines 7, 8 respectively connected to the memory cells to be selected.

The four memory blocks each having a storage capacity of four megabits in the memory cell arrays 1 in each case contain 1024 word lines and 4096 bit line pairs. The memory cell arrays 1 are in each case spaced apart from one another by amplifier blocks 4.

For the driving of the row decoders 2, which can simultaneously activate in each case at most one word line 7 per memory cell array 1, a control circuit 5 is connected to the row decoders 2 on the control side. The control circuit 5 enables an addressing of the word lines 7 by the row decoders 2. In this case, the control circuit 5 is configured such that in each case at least two of the word lines 7 can be activated simultaneously, for example when a read or write command is present on an input side of the control circuit 5. In this case, the word lines 7 that can be activated simultaneously are in each case located in different memory cell arrays 1, so that a maximum of one word line 7 per memory cell array 1 can be activated.

By way of example, if a total of two word lines 7 are activated simultaneously and if a bit line 8 is activated, the result, compared with conventional configurations in which in each case only one word line 7 is ever activated simultaneously, is a doubled number of crossover points between the word lines 7 and the activated bit lines 8. Associated with this is the fact that the number of data to be read out is also doubled since a doubled number of crossover points results in double the number of data stored in memory cells.

For the read-out of the selected data, a multiplexer 6 is connected to the column decoder 3, which is coupled to the bit lines 8. The multiplexer 6 combines the data which can be provided on the input side and can be read from the respective memory cells to form a continuous data stream provided on the output side of the multiplexer 6.

In the present memory, in each case only one column or one bit line 8 is activated simultaneously and, accordingly, a counter that is costly to implement, a so-called column counter, can be obviated.

Given a burst length, that is to say given a number of selected memory cells or a number of read-out or write steps to be performed within an access cycle of two, for example, only one word line 7 is activated in a conventional memory architecture. Staying with this numerical example, the simultaneous activation, according to the invention, of two word lines 7, for example, leads to a burst length of four. Correspondingly, the simultaneous activation of four word lines 7 leads to a burst length of eight. In each case only one column address is selected simultaneously. The simultaneous activation of a plurality of word lines 7 leads to a correspondingly higher current consumption of the integrated memory; by way of example, the selection of two word lines 7 simultaneously instead of one word line 7 requires a doubled current. However, the likewise doubled burst length in this case results, as explained, that double the time is available for reading the data from the memory or for writing the data to the memory. Accordingly, the power converted in the memory is constant compared with conventional methods. Accordingly, the principle described also does not lead to impermissible heating of the memory, as would be the case with short bursts and a large number of simultaneously activated memory cells.

With the present integrated memory, very high data rates can be achieved at very high frequencies. In this case, the number of activated word lines 7 is varied with a variable burst length. Consequently, more data than necessary can be read from the memory. The data are combined by the multiplexer 6 to form a continuous data stream.

Overall, the FIGURE shows an integrated memory having sixteen memory cell arrays 1 that are each disposed next to one another and each contains four blocks having a storage capacity of four megabits in each case. Accordingly, the integrated memory shown thus has a total storage capacity of 256 megabits.

The principle described is suitable both for read accesses and for write accesses.

I claim:

1. An integrated memory, comprising:

a plurality of memory cell arrays having memory cells, word lines for selecting said memory cells, and bit lines for reading out or writing in data signals from/to said memory cells;

decoders, including word line decoders and a bit line decoder, connected to said memory cell arrays for selecting said bit lines and said word lines;

a control circuit having an input side and connected to said decoders, said control circuit addressing said word lines and said bit lines, and if one of a read command and a write command is present on said input side of said control circuit, at least two of said word lines can be activated simultaneously; and a multiplexer having an input side coupled to said bit line decoder for addressing said bit lines, said multiplexer configured such that in a burst mode read access, in each clock period, a datum assigned to addressed memory cells is output until a burst mode operation advances by a predetermined burst length;

the burst length being determined by a number of said word lines simultaneously activated by said control circuit.

2. The integrated memory according to claim 1, wherein said word lines which can be activated simultaneously by said control circuit are disposed in different ones of said memory cell arrays which are each assigned one of said word line decoders.

3. The integrated memory according to claim 1, wherein said control circuit, for the simultaneous activation of exactly two of said word lines, is connected to said word line decoders assigned to respective ones of said memory cell arrays.

4. The integrated memory according to claim 1, wherein said control circuit, for the simultaneous activation of exactly four of said word lines, is connected to said word line decoders assigned to respective ones of said memory cell arrays.

5. The integrated memory according to claim 1, wherein said multiplexer is constructed such that the predetermined burst length is dependent on a number of said word lines respectively activated simultaneously by said control circuit.

* * * * *